(12) United States Patent
Liao et al.

(10) Patent No.: US 7,579,859 B2
(45) Date of Patent: Aug. 25, 2009

(54) METHOD FOR DETERMINING TIME DEPENDENT DIELECTRIC BREAKDOWN

(75) Inventors: Pei-Chun Liao, Jhubei (TW); Chia-Lin Chen, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/763,077

(22) Filed: Jun. 14, 2007

(65) Prior Publication Data

US 2008/0309365 A1    Dec. 18, 2008

(51) Int. Cl.
 *G01R 31/26* (2006.01)
(52) U.S. Cl. ...................... 324/769; 324/766
(58) Field of Classification Search ............. 324/769, 324/766, 719, 551; 702/108
See application file for complete search history.

(56) References Cited

U.S. PATENT DOCUMENTS 5,594,349 A * 1/1997 Kimura ...................... 324/551
6,541,285 B2 * 4/2003 Koike ........................... 438/14

OTHER PUBLICATIONS

Zhi Cui et al., Substrate current, gate current and lifetime prediction of deep-submicron nMOS devices, Aug. 26, 2004, Solid State Electronics 49 (2005) 505-511.*

Naoyoshi Tamura and Masataka Kase, A Proper Lifetime-Prediction Method of PMOSFET With 1.1NM Gate Dielectrics in the Lower Testing Voltage Region, 2003, IEEE 03CH37400. 41st Annual International Reliablity Physics Symposium, Dallas, Texas, 2003, 578-579.*

Liao et al., "A new 'multi-step' power-law TDDB lifetime model and boron penetration effect on TDDB of ultra thin oxide", Apr. 15, 2007, IEEE 07CH37867 45th Annual International Reliability Physics Symposium, Phoenix, pp. 574-575.*

* cited by examiner

*Primary Examiner*—Ha Tran T Nguyen
*Assistant Examiner*—Shaun Campbell
(74) *Attorney, Agent, or Firm*—Slater & Matsil, L.L.P.

(57) ABSTRACT

The current invention provides a method of determining the lifetime of a semiconductor device due to time dependent dielectric breakdown (TDDB). This method includes providing a plurality of samples of dielectric layer disposed as a gate dielectric layer of a MOS transistor, approximating a source/drain current density distribution as a first function of voltage applied on the samples, approximating a substrate current density distribution as a second function of voltage applied on the samples, approximating a dielectric layer lifetime distribution as a third function of source/drain current density and substrate current density in the samples, deriving, from the first, the second, and the third functions, an empirical model wherein a dielectric layer lifetime is a function of voltage applied thereon, and using the model to determine dielectric layer lifetime at a pre-determined operating gate voltage.

25 Claims, 6 Drawing Sheets

METHOD FOR DETERMINING TIME DEPENDENT DIELECTRIC BREAKDOWN

TECHNICAL FIELD

The present invention relates generally to a method of evaluating the reliability of a semiconductor device and more particularly to a method of evaluating the time dependent dielectric breakdown (TDDB) of a dielectric layer in a semiconductor device, and even more particularly to a method of evaluating the time dependent dielectric breakdown (TDDB) of a gate dielectric layer in a MOSFET.

BACKGROUND

As the density of integrated circuits continues to increase, the scaling down of the dimensions of semiconductor devices in a semiconductor integrated circuit has followed. Today, a dielectric layer in a semiconductor device, such as the gate dielectric layer of a MOSFET (Metal Oxide Semiconductor Field Effect Transistor) has reduced in thickness into the nanometer range. On the other hand, supply voltages applied on a MOSFET gate electrode have scaled down much slower in order to maintain good device performance, such as minimum sub-threshold leakage current and minimum device delay. As a result, the electrical field in a gate dielectric layer has increased significantly with each device generation. Under such circumstances, the reliability of a gate dielectric layer is now regarded as more of an important issue than ever before. As an example, when an operating voltage is applied on a gate oxide layer, the oxide layer can be broken down at the point when a certain period of time has passed from the start of application of a gate voltage. As a result, the gate oxide layer looses the electrical insulating properties, causing the gate and the channel region to be electrically shorted, which, in turn, leads to the failure of a MOSFET. The time period mentioned above is generally referred to as gate oxide layer lifetime. Tests for determining the lifetime of a dielectric layer are generally called reliability tests.

Many different theoretical models were suggested to explain the time dependent dielectric breakdown (TDDB) of a gate dielectric layer. Two classes of breakdown mechanisms are described by most theories and are familiar to those skilled in the art. An intrinsic breakdown model suggested by experimental facts is as the following. When a bias is applied on a dielectric layer, for example, a gate oxide layer, carriers such as electrons in the channel region of an NMOS transistor, can gain energy under the high electric field and tunnel through the dielectric layer. The tunneling current increases very rapidly with the continuous reduction of the oxide layer thickness. These energetic electrons can generate electron/hole pairs in the oxide near the gate electrode (anode) through impact ionization. Holes thus created in the oxide may inject back into the substrate under the electrical field. This process creates numerous defects (energy traps) in the oxide layer. When defect density in oxide reaches some critical level, a conductive path from the gate electrode to the substrate is formed, which causes device failure. Extrinsic breakdown are breakdown events attributable to defects brought into the oxide during manufacturing processes. These defects may include oxide roughness, particles in oxide, etc. Extrinsic breakdown are electric field and temperature dependent and are usually observed as early failures compared with intrinsic breakdown.

FIG. 1 shows the time evolution of gate leakage current of a MOS transistor subjected to time dependent dielectric breakdown (TDDB) on a gate dielectric layer. The gate leakage current $I_g$ increases gradually as defects are accumulated in the gate dielectric layer. This process ultimately leads to device breakdown as a conductive path is formed between the gate electrode and the substrate. The gate dielectric layer lifetime is labeled as $T_{bd}$ in FIG. 1.

Reliability testing is usually conducted on a semiconductor device to guarantee the device performance remains within the device's specification for a determined period of time. In view of gate oxide breakdown, the generally adopted industry standard is that, after 10 years of operation at the nominal conditions (voltage and temperature) at most 100 devices per million can fail. In practice, reliability testing on a gate oxide is usually carried out in an "accelerated" manner where excess stress (voltage and/or current) is applied on the gate oxide to accelerate the breakdown process since reliability testing under operating conditions will take an impractically long period of time. Such accelerated testing is generally referred to as a "burn-in" test by those skilled in the art. Under high stresses of a burn-in test, the oxide accumulates defects faster and a device fails more quickly. A gate oxide failure distribution and an acceleration factor of the stress can be obtained from a burn-in condition. The lifetime of a gate oxide under operating conditions can then be obtained by "extrapolating" the distribution under burn-in conditions to the operating conditions. Many prior art methods of a TDDB burn-in test exist. Examples include constant voltage test, constant current test, ramp voltage test and ramp current test. To demonstrate the shortcomings of prior art test methodologies, a detailed description is given herein to the constant voltage TDDB test method of prior art as the following.

In a prior art TDDB test for extracting an acceleration factor and estimating an oxide layer lifetime, constant stress voltages are applied to a gate oxide layer through the conductive gate electrode and the semiconductor substrate. Periods of time between the start of stress voltage application and a corresponding accumulated breakdown rate are recorded and plotted such as shown in FIG. 2A. In FIG. 2A, the horizontal axis represents stress time for which a stress voltage is applied on an oxide layer, while the right-hand vertical axis represents the accumulated failure rate P due to time dependent dielectric breakdown (TDDB) of a gate oxide layer and the left-hand vertical axis represents the ln $\{-\ln(1-p)\}$ calculated from the accumulated failure rate P. In conducting a TDDB test using this method, semiconductor wafers with a plurality, usually dozens or even hundreds, of gate oxide reliability test samples identical in shape, size, thickness, and production process are prepared. These samples are divided into a few groups, usually three groups. Samples of each group are subjected to a pre-determined stress voltage of V1, V2 or V3 respectively, which is much higher than the maximum voltage $V_{max}$ applied on a gate oxide layer under normal operating conditions. Under such stress application, oxide layers of each group experience a time dependent dielectric breakdown and the number of failed oxide layers increases with the passage of time. In FIG. 2A, the circle points, square points and triangle points represent respectively the accumulated failure rate at the points of time when oxide layers of each group fail under the stress voltages V1, V2 or V3. Based on this data, regression lines from, for example, least squares fitting can be drawn in order to obtain the accumulated failure rate at certain point of time when oxide layers of each group are under respective stress voltages. Shown in FIG. 2A, the plotting has a stress time on the horizontal coordinate in logarithm scale and ln $\{-\ln(1-p)\}$ on the vertical coordinate. This is generally referred to as Weibull plotting since the accumulated failure rates ln $\{-\ln(1-p)\}$ of the oxide layers follow the so-called Weibull distribution, which, empirically, is in the form of straight line. As a result, the periods of time during which the accumulated failure rates P reaches 50% under a stress voltage can be obtained, which, as a widely accepted criterion, represents an estimation of oxide layer lifetime. In the current prior art method, the estimation of oxide layer lifetime under stress voltages V1, V2 and V3 are recorded at the points where the Weibull plots intersect the long horizontal dash line, which corresponds to the 50% accumulated failure rate due to time dependent dielectric breakdown of oxide layers and are labeled as T1, T2 and T3 respectively.

With the estimated oxide layer lifetime T1, T2 and T3 (time for 50% accumulated failure rate) obtained from FIG. 2A, oxide layer lifetime $T_{bd}$ versus stress voltages are plotted as circle points as shown in FIG. 2B, where the estimated oxide layer lifetime T1, T2 and T3 are plotted in a logarithm scale on the vertical coordinate, while the stress voltages V1, V2 and V3 applied on the oxide layers are plotted in a linear scale on the horizontal coordinate. Empirically, the distribution of the circle points is in the form of a linear distribution and a linear regression line can be formed through proper fitting techniques, such as, least square fitting. Consequently, the oxide layer lifetime T can be approximated in the form of a linear function of applied voltage $V_g$. The slope of the straight line is extracted as a voltage acceleration factor. The estimated lifetime $T_{life}$ of an oxide layer under normal device operating conditions, e.g., $V_{max}$=2.0V, can be obtained by extrapolating this straight line into the operating voltage region to intersect with the dashed vertical line $V_g$=2.0 V, as shown in FIG. 2B. In this example, the estimated gate oxide lifetime $T_{life}$ is approximately 10 years.

Although an estimated oxide layer lifetime can be obtained through an "extrapolating" method as described in the above prior art method, TDDB tests employing an "extrapolating" scheme have some common drawbacks. First, a process condition change, in particular, changes relating to steps of forming a gate in a MOSFET will most likely change the quality of a gate oxide layer. Therefore, it is required to frequently conduct reliability testing, such as TDDB tests in an integrated circuit manufacturing environment in order to estimate the gate oxide lifetimes of devices from changed process conditions. Even though burn-in testing is employed to "accelerate" device failure, prior art test methods, such as the constant voltage method described in above example, still last for days or even weeks to obtain the voltage acceleration factor and estimated oxide layer lifetime. Due to this hindrance, in practice, TDDB tests are only conducted under a few stress voltages on a limited number of samples out of a manufactured batch. These limitations lead to poor statistics on test results. As a result, oxide layer lifetime obtained through the prior art method is, in general, stress voltage dependent. This drastically increases the errors in the voltage acceleration factor and estimated oxide layer lifetime.

On the other hand, when extrapolating the linear regression line into the operating voltage region to obtain oxide layer lifetime under normal device operating conditions, as shown in FIG. 2B, an assumption is made in that the oxide layer exhibits the same dielectric behaviors at low voltages (low oxide field) as those at stress voltages. Unfortunately, this assumption is very rough and produces large errors in the extraction of voltage acceleration factors and oxide layer lifetime estimation. As an example, the high electric field in an oxide layer under high stress voltages generates a large amount of heat, which causes the oxide layer to increase in temperature. This leads to a shorter time period between the application of stress voltages and the time dependent dielectric breakdown (TDDB) of the oxide layer, when compared to the oxide layer breakdown time period with the use of normal temperatures and operating voltages. In other words, the oxide layer lifetime estimated from a burn-in test tends to be shorter than the period of time an oxide layer can actually function within its specification under nominal operating conditions. On occasion, an estimation error can be as large as years. This problem can also lead to a major impact on the cost of a semiconductor device manufacturing facility, where devices with good reliability can be unfavorably downgraded or scrapped due to the overly conservative estimation on oxide layer lifetime from a burn-in test.

In view of these and other drawbacks in a prior art TDDB test method, there is a need for an improved method in measuring the time dependent dielectric breakdown (TDDB) on dielectric layers in a practically short period of time, and in obtaining a voltage acceleration factor and oxide layer lifetime estimation value which are practically highly precise.

SUMMARY OF THE INVENTION

These and other problems are generally solved or circumvented, and technical advantages are generally achieved, by preferred embodiments of the present invention wherein time-to-breakdown tests on dielectric layer samples are needed under only one stress voltage, instead of three as in prior art methods. Moreover, TDDB lifetime versus applied voltage relationships obtained through preferred embodiments can reflect the dielectric layer behavior in different voltage regions. These advantageous features of preferred embodiments enable a quick, accurate estimation on dielectric layer lifetime when a device operates at a pre-determined operating voltage.

In accordance with a preferred embodiment of the present invention, a method of determining a time dependent electrical breakdown characteristic of a dielectric layer in a semiconductor device comprises providing a plurality of samples of dielectric layer disposed as a gate dielectric layer of a MOS transistor, approximating a source/drain current density distribution as a first function of voltage applied on said samples, approximating a substrate current density distribution as a second function of voltage applied on said samples, approximating a dielectric layer lifetime distribution as a third function of source/drain current density and substrate current density in said samples, deriving, from said first, second, and third functions, an empirical model wherein a dielectric layer lifetime is a function of voltage applied thereon, and using said model to determine dielectric layer lifetime at a pre-determined operating gate voltage.

In accordance with another preferred embodiment of the present invention, a method of determining the lifetime of a dielectric layer in a semiconductor device comprises providing samples of dielectric layer having substantially same thickness disposed as respective gate dielectric layers of a plurality of MOS transistors, applying to a first plurality of said samples gate voltages in an incremental manner and measuring source/drain current density and substrate current density at each of said incremental gate voltages, approximating a first and a second function describing the relationships between said gate voltages and said source/drain current density and said substrate current density, applying to a second plurality of said samples a stress voltage and measuring, on each sample, source/drain current density, substrate current density and time to breakdown, approximating a third function describing the relationships between said source/drain current density, said substrate current density and times to breakdown, and deriving from said first, second, and third function a model describing the relationship between time to breakdown and gate voltage applied thereon and estimating there from a dielectric layer lifetime at pre-determined operating gate voltage.

In accordance with yet another preferred embodiment of the present invention, a method of determining the lifetime of a gate dielectric layer in a MOS transistor comprises providing a plurality of MOS transistors each having gate dielectric layer of same material, applying to a first plurality of said transistors gate voltages in an incremental manner and measuring source/drain current density and substrate current density at each of said incremental gate voltages, obtaining a function describing the relationships between said gate voltages and said source/drain current density and said substrate current density, applying to a second plurality of said transistors a stress voltage and measuring, on each sample, source/drain current density, substrate current density and time to breakdown, obtaining a function describing the relationships between said source/drain current density, said substrate current density and times to breakdown, and obtaining a function describing the relationship between gate voltages and times to breakdown and estimating a dielectric layer lifetime at a pre-determined operating gate voltage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a method of determining the lifetime of a gate dielectric layer through correlation between source/drain current, substrate current, and voltage applied on a gate electrode of a MOSFET.

Figure 1:
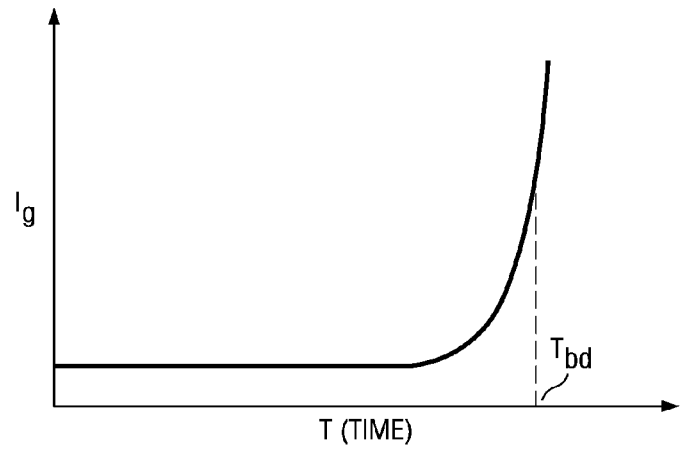
FIG. 1 shows the time evolution of gate leakage current of a MOS transistor subjected to time dependent dielectric breakdown (TDDB) on the gate dielectric layer.
Figure 2A:
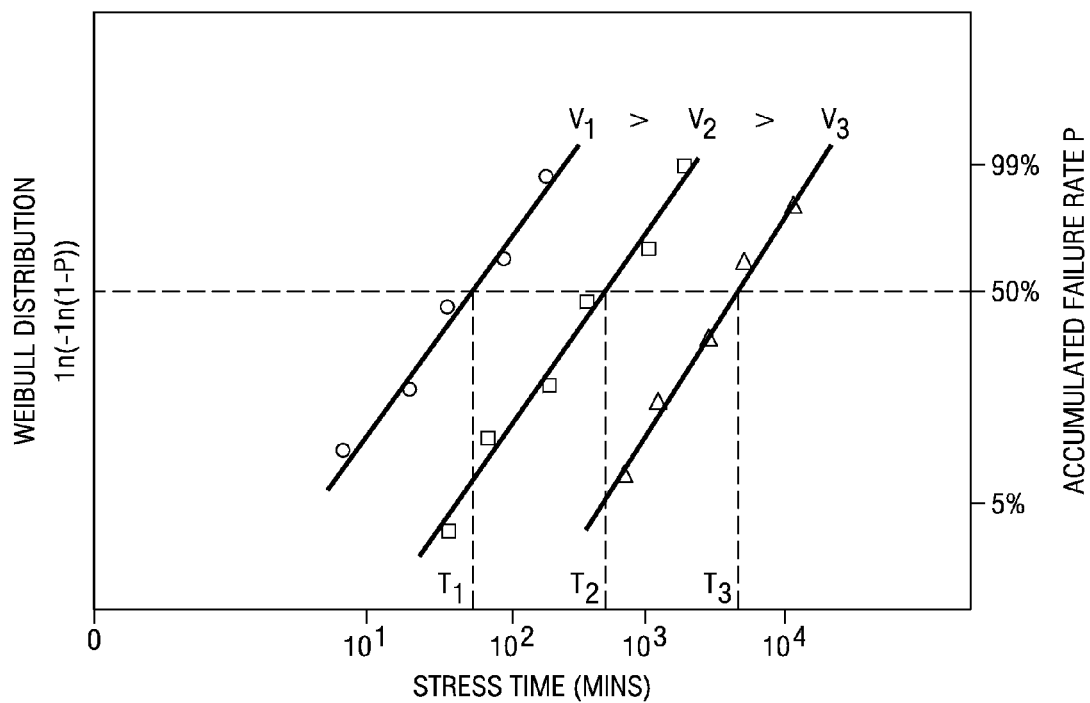
FIG. 2A shows the measurement results of oxide layer lifetime under stress voltages according to a prior art.
Figure 2B:
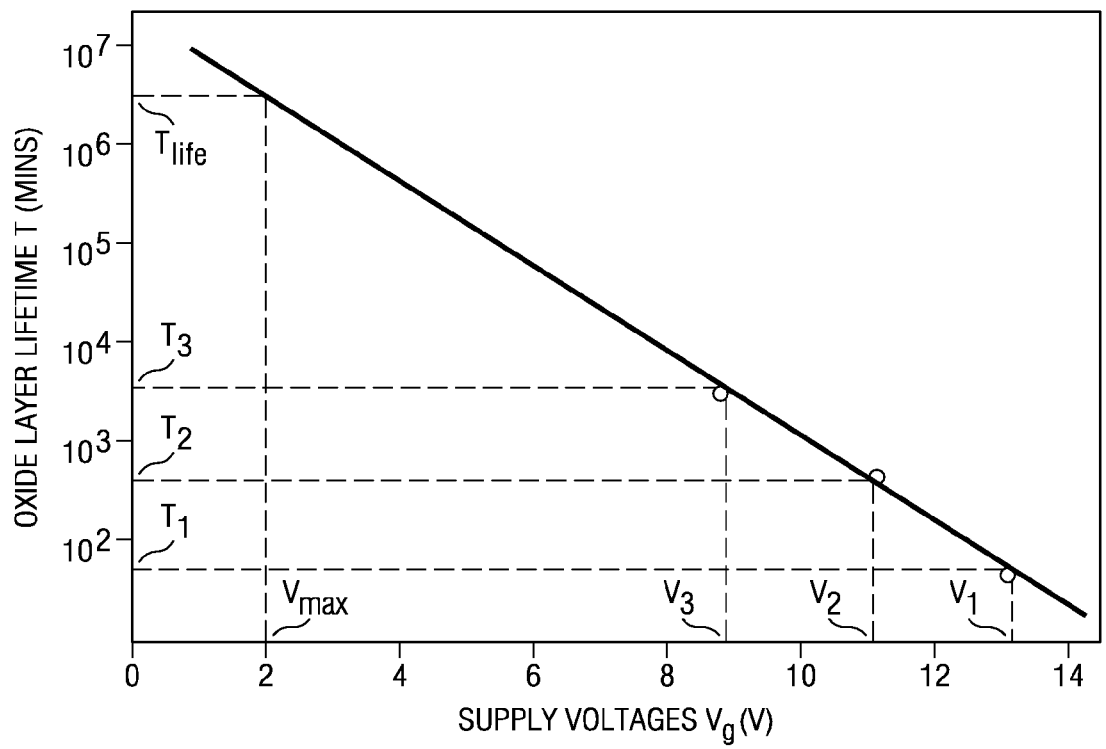
FIG. 2B illustrate a regression line used for estimating the oxide layer lifetime according to a prior art.
Figure 3:
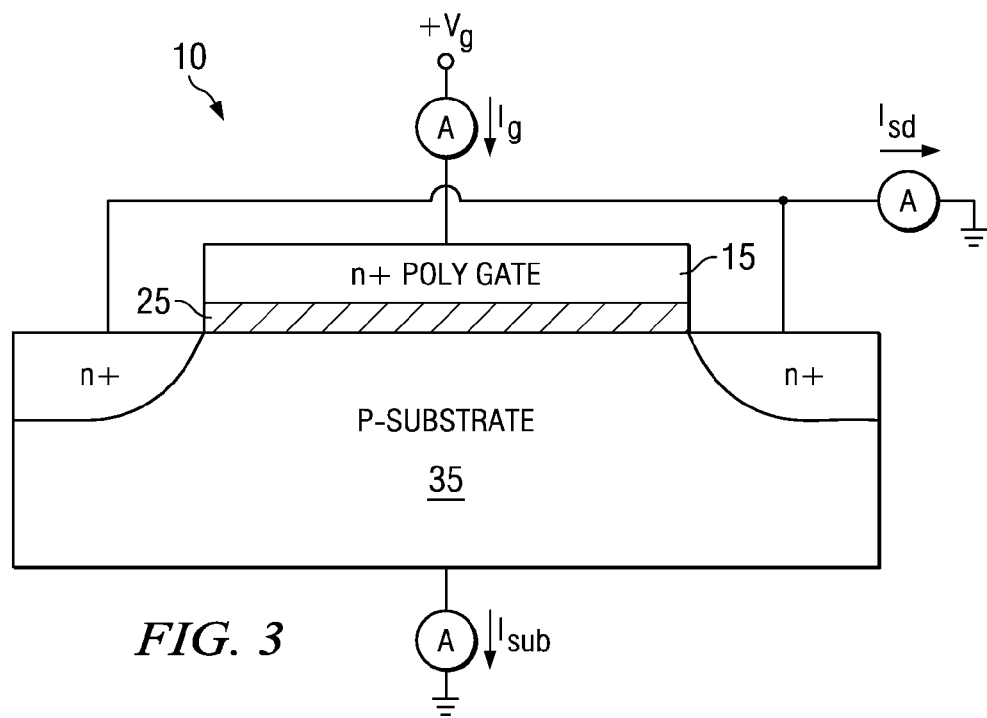
FIG. 3 is a schematic cross-sectional view of a device configuration for conducting TDDB measurement on a gate dielectric layer in preferred embodiments.

Shown in FIG. 3 is a schematic cross-sectional view of a device configuration for conducting TDDB measurement on a gate dielectric layer of a MOSFET in preferred embodiments. In FIG. 3, an NMOS transistor 10 is provided, a DC gate voltage $V_g$ is applied on the conductive gate electrode 15 and the gate leakage current $I_g$ is measured and recorded. In one embodiment, gate electrode 15 is an N-doped polysilicon layer, although gate electrode made by other conductive materials is not excluded. The substrate 35 of NMOS transistor 10 is a lightly-doped P-type semiconductor substrate preferably made of silicon, although other P-type semiconductor materials, such as silicon germanium, gallium arsenide, indium phosphide, are not excluded. In conducting TDDB measurements in preferred embodiments, substrate 35 is connected to the ground and the current $I_{sub}$ flowing from the substrate into the ground is measured and recorded. Gate dielectric layer 25 is formed on the substrate surface and sandwiched between gate electrode 15 and substrate 35, where its lifetime due to time dependent dielectric breakdown (TDDB) is to be measured. In one embodiment, gate dielectric layer 25 is a silicon dioxide layer having a thickness in the range of between 1.2 nm and 5 nm, although preferred embodiments impose no restrictions on the gate dielectric material and range of thickness. The heavily-doped source and drain regions of NMOS transistor 10 are electrically tied together and connected to the ground through a current meter, where the current $I_{sd}$ is measured and recorded.

Figure 4:
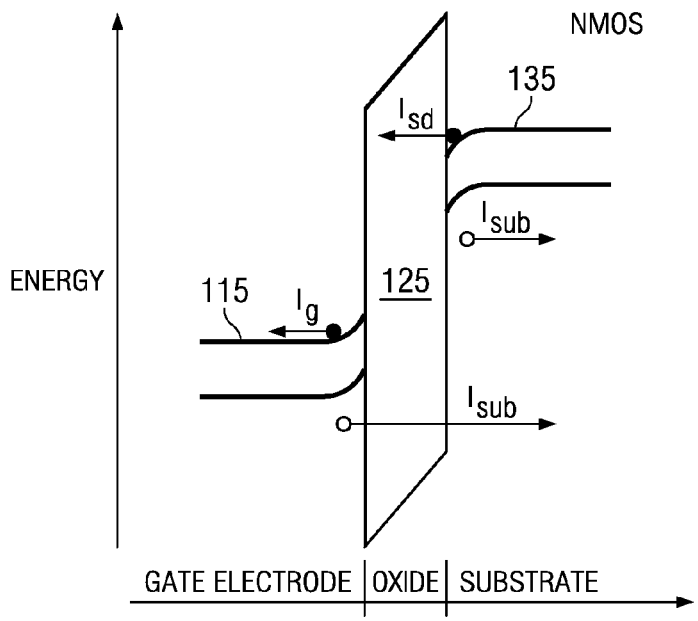
FIG. 4 is an energy band diagram of an NMOS transistor under bias configuration of FIG. 3.

FIG. 4 is an energy band diagram of an NMOS transistor under bias configuration of FIG. 3 and is used to illustrate the measurement technique of preferred embodiments. The energy band diagram is a plot of the band energy in an NMOS transistor versus the position of the structures of the NMOS transistor. As appreciated by those skilled in the art, when a positive DC voltage $V_g$, greater than the gate threshold voltage, is applied on the gate electrode 15 of NMOS transistor 10 of FIG. 3, the transistor is in the condition of strong inversion where the electron density at the substrate surface under gate dielectric layer 25 is greater than the hole density in the bulk of substrate 35. An energy band diagram as shown in FIG. 4 is formed in the NMOS transistor. A first portion 115 of the band diagram is for the gate electrode 15 of transistor 10. A second portion 125 of the band diagram is for the gate dielectric layer 25 of transistor 10. A third portion 135 of the band diagram is for the substrate 35 of transistor 10. When voltage $V_g$ is applied on gate electrode 15, electrons (solid circle points in FIG. 4) in the channel region in substrate 35 may overcome energy barrier 125 and tunnel through gate dielectric layer 25. The electrons tunneling from the channel are supplied by source and drain of transistor 10 and the tunneling current $I_{sd}$ can be measured through a current meter connected between source/drain contacts and ground, as shown in FIG. 3. Holes (empty circle points in FIG. 4) left behind in substrate 35 are collected by the substrate contact connected to the ground, forming substrate current $I_{sub}$. Moreover, energetic electrons injected into the gate dielectric 25 can generate hole/electron pairs in gate dielectric 25 through impact ionization. Holes thus created may inject back into the substrate 35 under the electrical field and form the so-called hole injection current, also contributing to the substrate current $I_{sub}$.

In brief, when the gate dielectric layer of an NMOS transistor is under positive electric stress, gate leakage current $I_g$, which causes the ultimate gate dielectric breakdown, is composed of tunneling electron current $I_{sd}$ and injected hole current $I_{sub}$, i.e., $I_g=I_{sd}+I_{sub}$. Note that $I_{sd}$ and $I_{sub}$ change in correspondence with stress voltage $V_g$ (i.e., $I_{sd} \sim V_g$, $I_{sub} \sim V_g$) and can be separately measured using the TDDB measurement configuration shown in FIG. 3. By measuring the increases in tunneling current $I_{sd}$ and substrate current $I_{sub}$, defects generated during the TDDB stress test can be estimated. This increase in defects can be correlated to the lifetime of a gate dielectric layer, i.e., $T_{bd} \sim (I_{sd}, I_{sub})$. Therefore, through measuring device parameters, such as $I_g$, $I_{sd}$, $I_{sub}$, and $V_g$ from a preferred test configuration and by determining an experimental relationship between those variables through proper mathematical fitting techniques, an empirical model of $T_{bd} \sim V_g$ can be obtained, which could, in turn, predict the lifetime $T_{bd}$ of a gate dielectric layer when a MOSFET device operates under pre-determined operating conditions.

Figure 5:
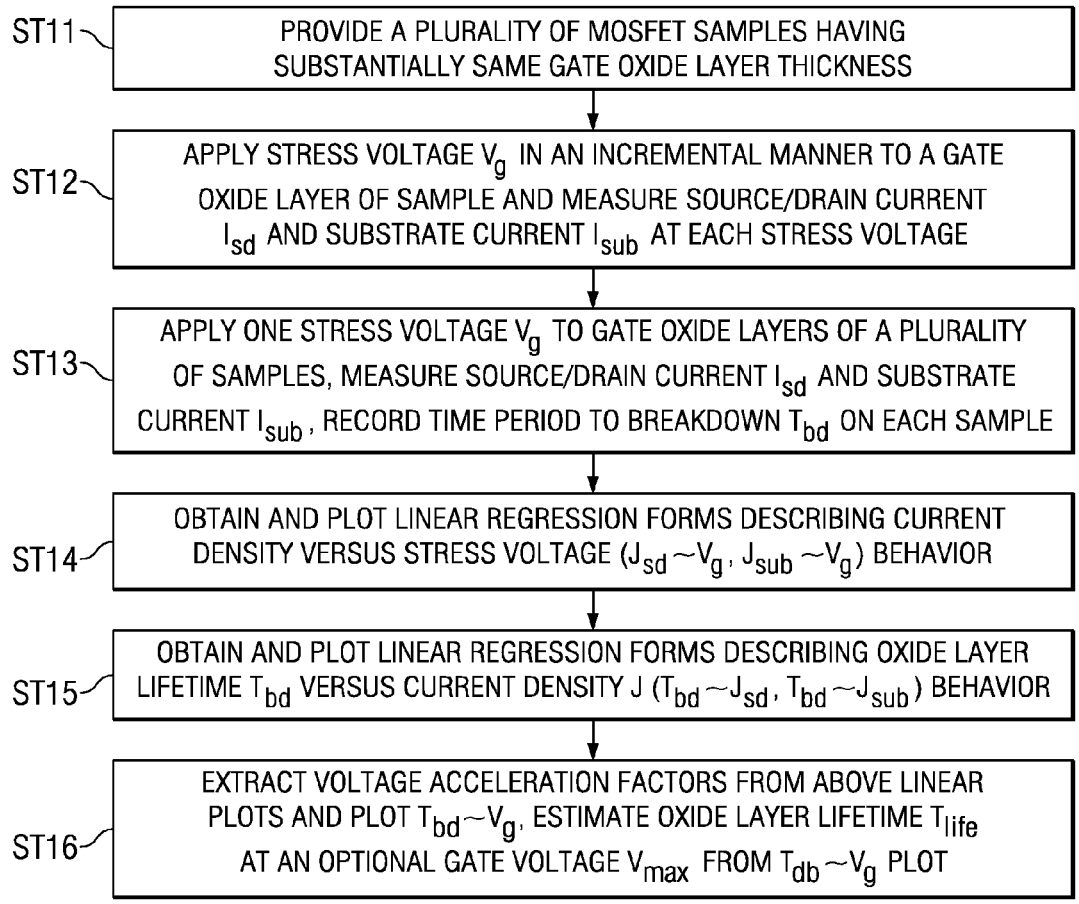
FIG. 5 is a flow chart illustrating the steps of conducting TDDB lifetime estimation according to one embodiment.
Figure 6:
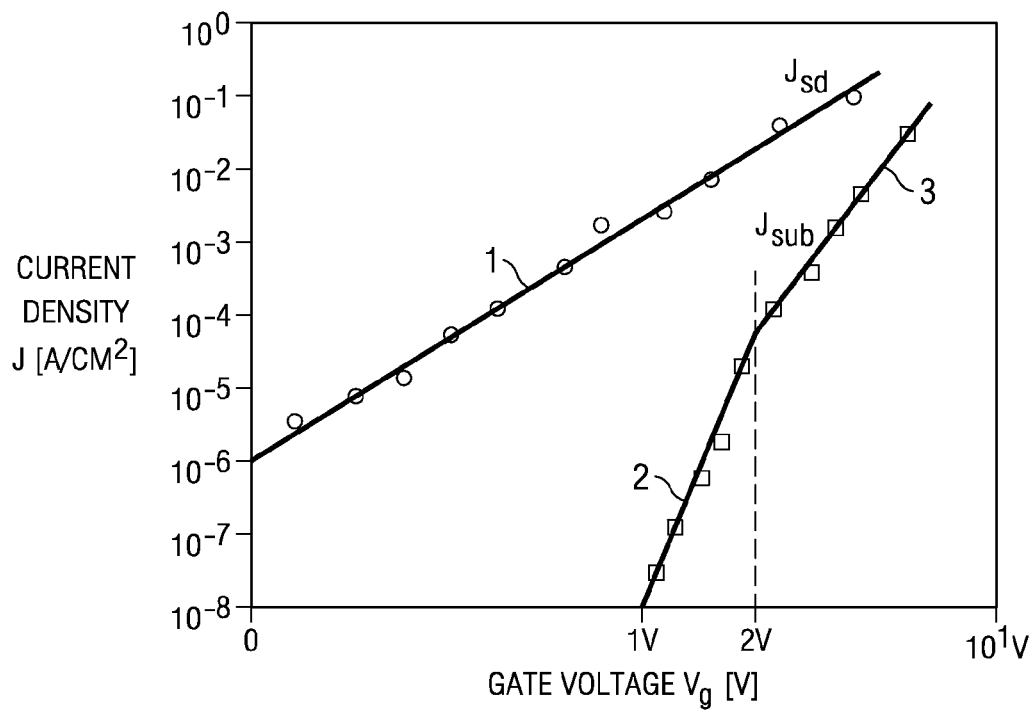
FIG. 6 is a view illustrating the measurement results of source/drain current density $J_{sd}$ and substrate current density $J_{sub}$ under different stress voltage $V_g$ according to one embodiment.
Figure 7:
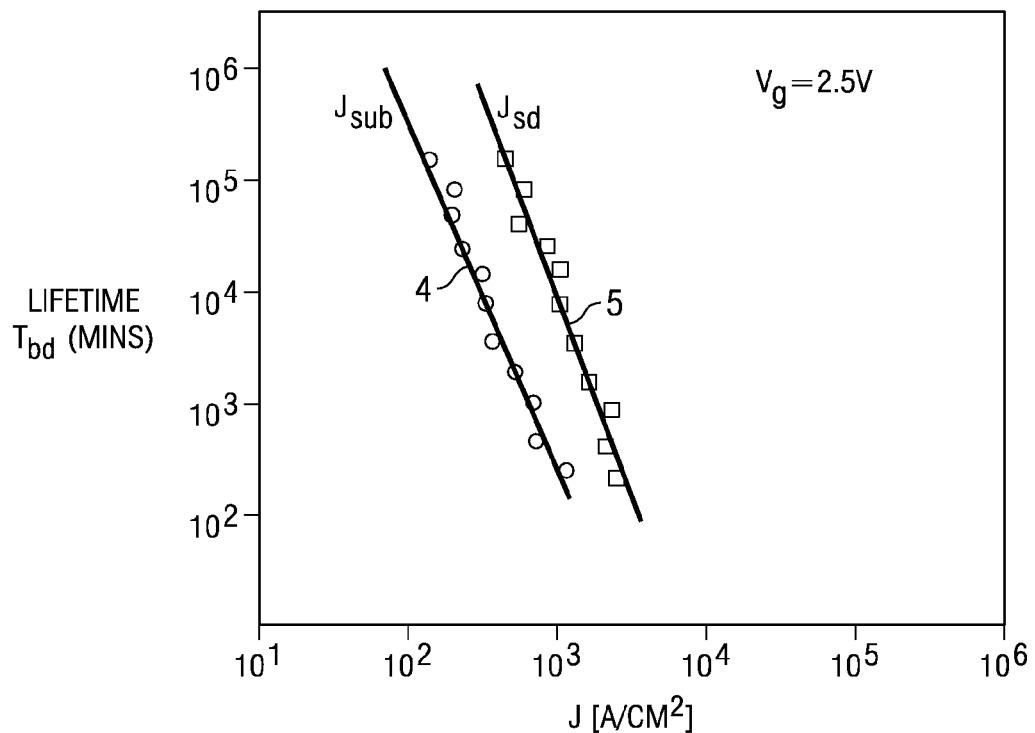
FIG. 7 is a view illustrating the measurement results of gate oxide layer lifetime $T_{bd}$ when different gate leakage current J presents in gate oxide layer according to one embodiment.
Figure 8:
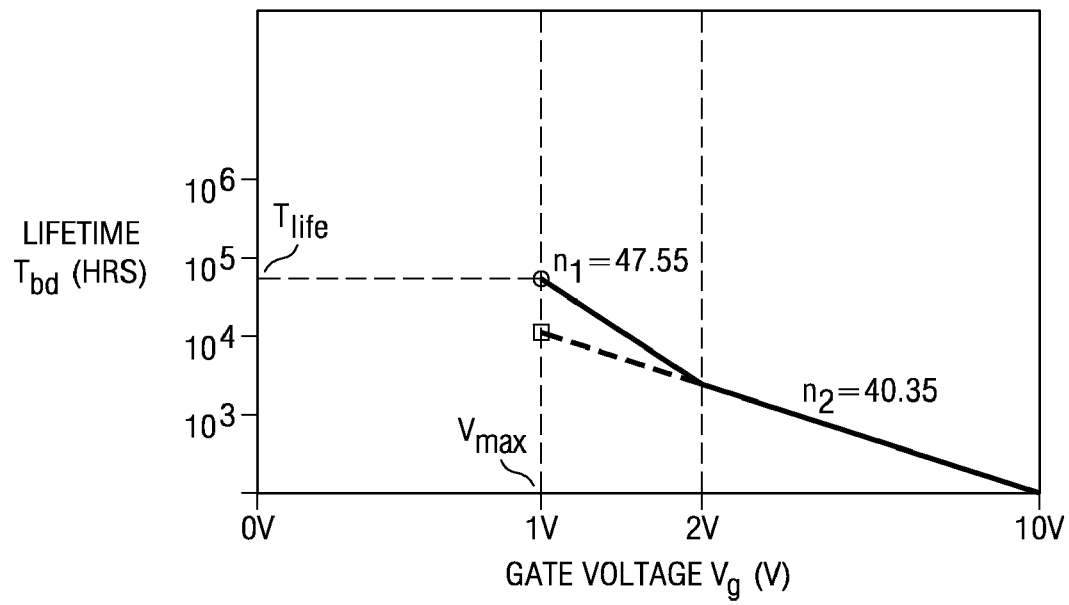
FIG. 8 shows a regression line describing the relationships between gate oxide layer lifetime $T_{bd}$ and voltage $V_g$ applied on a gate oxide layer, which is used for estimating the gate oxide layer lifetime according to one embodiment.

FIG. 5 is a flow chart illustrating the steps of conducting TDDB lifetime measurement according to one embodiment. FIG. 6 is a view illustrating the measurement results of source/drain current density $J_{sd}$ and substrate current density $J_{sub}$ under different stress voltages $V_g$. FIG. 7 is a view illustrating the measurement results of gate oxide layer lifetime $T_{bd}$ when different gate leakage current density $J_g$ exists in gate oxide layer. FIG. 8 illustrates the relationships between gate oxide layer lifetime $T_{bd}$ and voltage $V_g$ applied on a gate oxide layer.

According to ST11 in FIG. 5, a batch of NMOS transistor TDDB test samples (DUTs) having a substantially equal thickness of gate oxide is provided. In one embodiment, NMOS transistor samples have a substantially equal gate oxide layer thickness of 1.2 nm. A DC voltage $V_g$ of 1.0 V used for operating condition in current embodiment, is first applied on gate electrode 15 (see FIG. 3) to verify the integrity of the gate oxide layer 25. Next, according to ST12 of FIG. 5, $V_g$ is lowered to a predetermined start voltage (depends on the technology), e.g., 0.1 V, under which source/drain current $I_{sd}$, substrate current $I_{sub}$ and gate leakage current $I_g$ are measured and recorded. At about equal time intervals, stress voltage $V_g$ is raised in equal voltage increments, e.g., 0.2 V, and source/drain current $I_{sd}$, substrate current $I_{sub}$ and gate leakage current $I_g$ are again measured and recorded. This process continues until stress voltage $V_g$ reaches about two to three times the normal operating voltage applied on a gate oxide layer under a nominal device operating condition.

Further, as described in ST13 of FIG. 5, a stress gate voltage $V_g$ is applied on the gate oxide layers of a plurality of unprobed DUTs until there is a sharp increase in the gate leakage current $I_g$ on each sample which indicates the breakdown of gate dielectric layer 25. In one embodiment, $V_g$ of 2.5V is applied on a plurality of NMOS transistor test samples having a gate oxide layer of 1.2 nm. Due to the variation in processing conditions in forming gate oxide layer 25 of sample transistors, gate leakage current density $J_g$ varies from sample to sample and, consequently, the lifetime $T_{bd}$ of each gate oxide layer sample also varies. In ST13, $I_g$, $I_{sd}$, and $I_{sub}$ of each sample are measured and recorded, and the respective lifetime $T_{bd}$ is measured and recorded. In an exemplary embodiment, the lifetime $T_{bd}$ of a gate oxide layer is determined when a gate oxide leakage current $I_g$ of 50 nA is observed. In other embodiments, the $T_{bd}$ could be determined with reference to some other standards.

At a step ST14 in FIG. 5, the relationships between the source/drain current density $J_{sd}$, substrate current density $J_{sub}$ and gate oxide stress voltage $V_g$, are plotted. This is also shown in FIG. 6, wherein the horizontal axis represents stress voltage $V_g$ applied to the gate oxide layer 25 of an NMOS transistor 10 as in FIG. 3. The vertical axis represents current density J calculated from the measured current. The circle points represent source/drain current density $J_{sd}$ calculated from $I_{sd}$ measured at each stress voltage $V_g$. The square points represent substrate current density $J_{sub}$ calculated from $I_{sub}$ measured at each stress voltage $V_g$. Based upon statistical analysis on the raw data, a trend of linear distribution between $J_{sd}$ and $V_g$, $J_{sub}$ and $V_g$ in logarithmic scale is observed. Consequently, $V_g$ and current density $J_{sd}$, $J_{sub}$ are plotted in logarithmic scale as in FIG. 6. Linear regression lines can be formed through appropriate mathematical fitting techniques, such as least square fitting. As can be seen, the distribution of the square points of the substrate current density $J_{sub}$ exhibits different linear trends in different regions of gate stress voltage $V_g$, and fitting techniques, such as least square fitting, can be applied in each region. As a result, the slope of each linear regression line can be calculated and an empirical linear function describing the J-$V_g$ characteristics of the test device can be described as the following:

$$J_{sd} \sim V_g^{S1} \qquad (1)$$

Where "S1" is the slope of the straight regression line 1 representing the relationship between source/drain current density $J_{sd}$ and gate stress voltage $V_g$. In current embodiment, S1 equals 3.5. Similarly, we can obtain:

$$J_{sub} \sim 0 \text{ (when } V_g < 1.0 \text{ V)} \qquad (2A)$$

For voltage smaller than operation condition is not discussed.

Similarly, we can obtain:

$$J_{sub} \sim V_g^{S2} \text{ (when } 1.0 \text{ V} < V_g < 2.0 \text{ V)} \qquad (2B)$$

Where "S2" is the slope of the straight regression line 2, which represents the relationship between substrate current density $J_{sub}$ and gate stress voltage $V_g$, when $V_g$ is greater than 1.0 V, but smaller than 2.0 V. In the current embodiment, S2 equals 9.8.

In a similar manner, we can obtain:

$$J_{sub} \sim V_g^{S3} \text{ (when } V_g > 2.0 \text{ V)} \qquad (2C)$$

Where "S3" is the slope of the straight regression line 3, which represents the relationship between substrate current density $J_{sub}$ and gate stress voltage $V_g$, when Vg is greater than 2.0V. In the current embodiment, S3 equals 8.0.

According to ST15 of FIG. 5, the $T_{bd}$-J relationship is plotted from data collected through ST13 of FIG. 5, is shown in FIG. 7. In FIG. 7, the horizontal axis represents gate oxide leakage current density J and the vertical axis represents the measured gate oxide layer lifetime $T_{bd}$. The circle points represent measured gate oxide layer lifetime $T_{bd}$ versus gate oxide leakage current density $J_{sd}$ calculated from measured source/drain current $I_{sd}$ on device samples. The square points represent measured gate oxide layer lifetime $T_{bd}$ versus gate oxide leakage current density $J_{sub}$ calculated from measured substrate current $I_{sub}$ on device samples. Again, statistical analysis on raw data is conducted at this point in order to obtain, preferably, a linear trend between J and $T_{bd}$. In a current embodiment, a trend of linear distribution between $T_{bd}$ and current density J in logarithmic scale is observed. Consequently, $T_{bd}$ and J are plotted in logarithmic scale as shown in FIG. 7. Linear regression techniques can be used to fit the data points. In a current embodiment, least square fitting is applied to obtain linear regression lines 4 and 5. As FIG. 7 shows, $J_{sd}$ and $J_{sub}$ both account for the lifetime of a gate oxide layer, which has an approximate thickness of 1.2 nm. As a result, the slope of linear regression lines 4 and 5 from least square fitting can be obtained and an empirical function describing the $T_{bd}$-J characteristics of the gate oxide layer can be expressed as the following:

$$T_{bd} \sim J_{sub}^{-m1} J_{sd}^{-m2} \quad (3)$$

Where "m1" is the slope of the straight regression line 4, which represents the relationship between the substrate current density $J_{sub}$ and gate oxide layer lifetime $T_{bd}$. The variable "m2" is the slope of the straight regression line 5, which represents the relationship between the source/drain current density $J_{sub}$ and gate oxide layer lifetime $T_{bd}$. As an example, "m1" and "m2" equal 3.3 and 3.6, respectively.

At a step ST16 in FIG. 5, the relationship between gate oxide layer lifetime $T_{bd}$ and gate oxide stress voltage $V_g$ can be obtained by substituting expressions (1), (2B) and (2C) into expression (3), yielding expressions 4A, and 4B as the following:

$$T_{bd} \sim V_g^{-(s1m1+s2m2)} = V_g^{-n1} \text{ (when } 1.0 \text{ V} < V_g < 2.0 \text{ V)} \quad (4A)$$

$$T_{bd} \sim V_g^{-(s1m1+s3m2)} = V_g^{-n2} \text{ (when } V_g > 2.0 \text{ V)} \quad (4B)$$

Where "n1" represents (s1m1+s2m2) and is referred to as the voltage acceleration factor when gate voltage $V_g$ is greater than operating voltage 1.0 V, but smaller than 2.0 V. The variable "n2" represents (s1m1+s3m2) and is referred to as the voltage acceleration factor when gate voltage $V_g$ is greater than 2.0 V. In a current embodiment, "n1", and "n2" equal 47.55 and 40.35 respectively.

Expressions 4A and 4B from above are plotted against the embodied voltage acceleration factors n1 and n2, as shown in FIG. 8. The horizontal axis represents stress voltage $V_g$ applied to the gate oxide layer 25 of an NMOS transistor 10 in FIG. 3, while the vertical axis represents the estimated gate oxide layer lifetime $T_{bd}$. $V_g$ and $T_{bd}$ in FIG. 8 are plotted in logarithmic scale. Linear regression lines corresponding to respective voltage acceleration factors are formed to represent the relationship between gate oxide lifetime $T_{bd}$ and gate dielectric voltage $V_g$ in different ranges. Gate oxide lifetime estimation under gate voltages smaller than operational voltage $V_g$ offers no practical meaning. No linear regression is formed in that range. To estimate TDDB lifetime $T_{life}$ of a gate oxide layer, one can first find the data point corresponding to an operational voltage $V_g$ on a $T_{bd}$-$V_g$ regression line obtained through the above steps. The vertical coordinate of the data point is the estimated gate oxide lifetime when a device operates under operational voltage $V_g$. In FIG. 8, the circle point corresponds to a gate supply voltage $V_{max}$ of 1.0 V on an embodied NMOS device. The corresponding vertical coordinate represents the estimated gate oxide lifetime $T_{life}$ when the device is operating under $V_{max}$. The square point corresponds to a gate oxide lifetime $T_{bd}$ estimation from "extrapolating" a $T_{bd}$-J relationship obtained when the embodied NMOS device is stressed by voltages greater than 2.0 V.

In another embodiment, a batch of NMOS transistor TDDB test samples having a substantially equal gate oxide thickness of 5 nm is provided. A DC sweep similar to that described in ST12 in FIG. 5 is applied on the gate oxide layers of a plurality of samples, where the starting voltage $V_g$ equals 0.2 V, and the sweeping step is about 0.5 V. Source/drain current $I_{sd}$, substrate current $I_{sub}$ and gate leakage current $I_g$ under each voltage $V_g$ are measured and recorded. This process continues until stress voltage $V_g$ reaches about 10.0V, which is about five times of the operating supply voltage when devices are under nominal operating conditions.

Further, as described in ST13 of FIG. 5, a stress gate voltage $V_g$ of 8.0 V is applied on the gate oxide layers of a plurality of unprobed samples. Source/drain current $I_{sd}$, substrate current $I_{sub}$ and total gate leakage current $I_g$ are measured and recorded. This stressing process continues until there is a sharp increase in the gate leakage current $I_g$ on each sample which indicates the breakdown of gate dielectric layer. The lifetime $T_{bd}$ of each gate oxide layer sample is measured and recorded. In a current embodiment, the lifetime $T_{bd}$ of a gate oxide layer is determined when gate oxide leakage current $I_g$ of 1 µA is observed.

Figure 9:
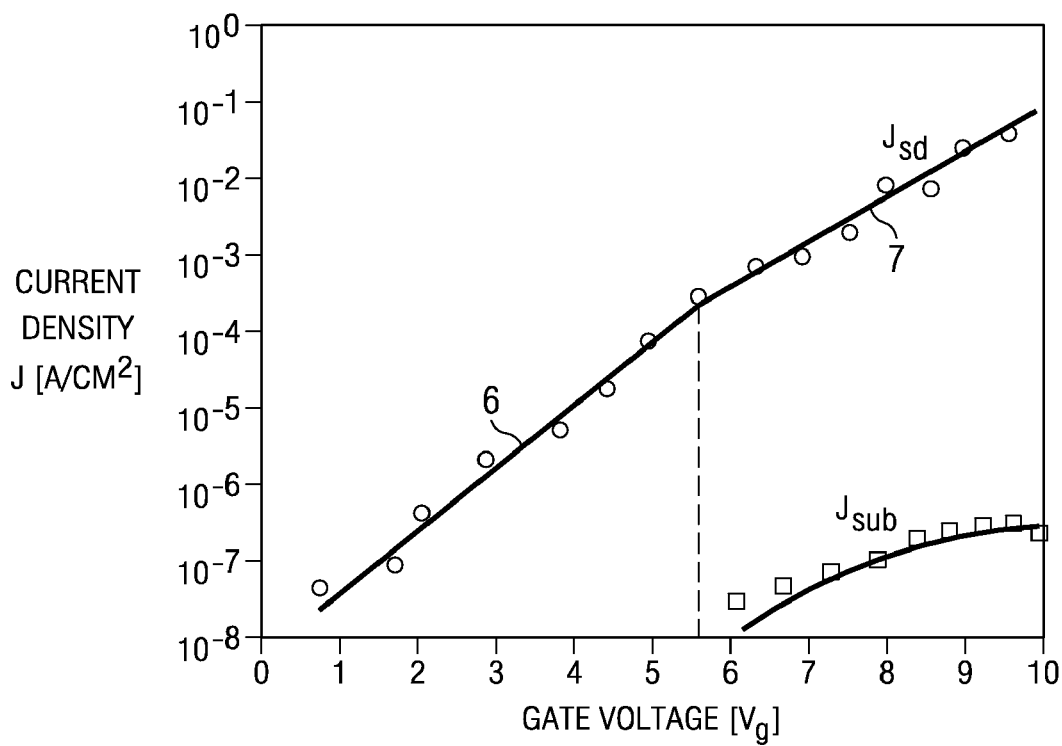
FIG. 9 is a view illustrating the measurement results of source/drain current density $J_{sd}$ and substrate current density $J_{sub}$ under different stress voltage $V_g$ according to another embodiment.

Upon statistical analysis on raw data collected from above steps, a trend of linear distribution is observed between $J_{sb}$ in logarithmic scale and $V_g$ in linear scale in two regions of gate stress voltage $V_g$. Consequently, $V_g$ in linear scale and current density $J_{sb}$ in logarithmic scale are plotted as shown in FIG. 9. In FIG. 9, the horizontal axis in linear scale represents stress voltage $V_g$ applied on the gate oxide layer 25 of an NMOS transistor 10 in FIG. 3, while the vertical axis in logarithm scale represents leakage current density J in gate oxide layer. The circle points represent source/drain current density $J_{sd}$ calculated from $I_{sd}$ measured at each stress voltage $V_g$. The square points represent substrate current density $J_{sub}$ calculated from $I_{sub}$ measured at each stress voltage $V_g$. As can be seen in FIG. 9, $J_{sub}$ is negligibly small when compared with $J_{sd}$. This implies that, in current embodiment, gate oxide leakage current $I_g$ is composed substantially by electron tunneling current $I_{sd}$, i.e., $I_g = I_{sd}$. Linear regression lines 6 and 7 can be formed through appropriate mathematical fitting techniques, such as least square fitting. As a result, the slope of each linear regression line can be calculated and an empirical linear function describing the J-V characteristics of the test samples in current embodiment can be described as the following:

$$J_{sub} \sim 0 \quad (5A)$$

$$J_g = J_{sd} \sim e^{S1 V_g} \text{ (when } V_g < 5.6 \text{ V)} \quad (5B)$$

Where "S1" is the slope of the linear regression line 6 representing the relationship between source/drain current density $J_{sd}$ and gate stress voltage $V_g$, when $V_g$ is smaller than 5.6 V. In the current embodiment, "S1" equals 5.3.

Similarly, we can obtain:

$$J_g = J_{sd} \sim e^{S2 V_g} \text{ (when } V_g > 5.6 \text{ V)} \quad (5C)$$

Where "S2" is the slope of the linear regression line 7 representing the relationship between source/drain current density $J_{sd}$ and gate stress voltage $V_g$, when $V_g$ is greater than 5.6 V. In the current embodiment, "S2" equals 3.7.

Figure 10:
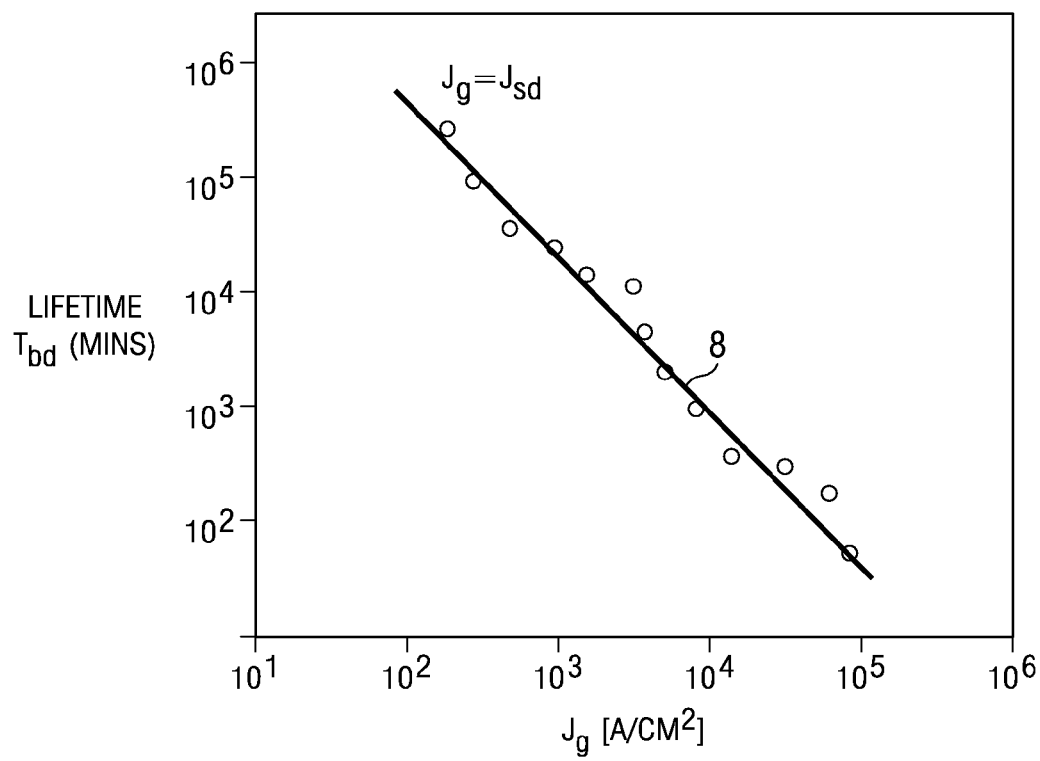
FIG. 10 is a view illustrating the measurement results of gate oxide layer lifetime $T_{bd}$ when different gate leakage current J presents in gate oxide layer according to another embodiment.

According to ST15 of FIG. 5, statistical analysis on raw data is conducted in order to obtain a preferable linear trend between J and $T_{bd}$. In a current embodiment, a trend of linear distribution between $T_{bd}$ and current density J in logarithmic scale is observed. Consequently, a $T_{bd}$-J relationship, corresponding to the current embodiment, is plotted as shown in FIG. 10. In FIG. 10, the horizontal axis in logarithmic scale represents current density J obtained through measured gate oxide leakage current $I_g$ on a gate oxide layer sample. The vertical axis in logarithm scale represents the estimated gate oxide layer lifetime $T_{bd}$. The circle points represent measured gate oxide layer lifetime $T_{bd}$ versus measured gate oxide leakage current $J_g$, which, in the current embodiment, is substantially the same as the measured source/drain current density $J_{sd}$ on device samples. Linear regression techniques can be used to fit the data points. In a current embodiment, least square fitting is applied to obtain a linear regression line 8 in FIG. 10. As a result, the slope of linear regression line 8 can be obtained and an empirical function describing the $T_{bd}$-J characteristics of the gate oxide layer can be expressed as the following:

$$T_{bd} \sim J_g^{-m} \quad (6)$$

Where "m" is the slope of the straight regression line 8, which represents the relationship between the gate oxide leakage current $J_g$ and gate oxide layer lifetime $T_{bd}$. In the current embodiment, "m" equals 1.5.

At a step ST16 in FIG. 5, the relationship between gate oxide layer lifetime $T_{bd}$ and gate oxide stress voltage $V_g$ can be obtained by substituting expressions (5B) and (5C) into equation (6):

$$T_{bd} \sim e^{-ms1 Vg} = e^{-\gamma 0 Vg} \text{ (when Vg<5.6 V)} \quad (7A)$$

$$T_{bd} \sim e^{-ms2 Vg} = e^{-\gamma 1 Vg} \text{ (when Vg>5.6 V)} \quad (7B)$$

Where "γ0" represents ms1 and is referred as the voltage acceleration factor when gate voltage $V_g$ is smaller than 5.6 V. The variable "γ1" represents ms2 and is referred as the voltage acceleration factor when gate voltage $V_g$ is greater than 5.6 V. In a current embodiment, "γ0" and "γ1" equal 8.0, and 5.6 respectively.

Figure 11:
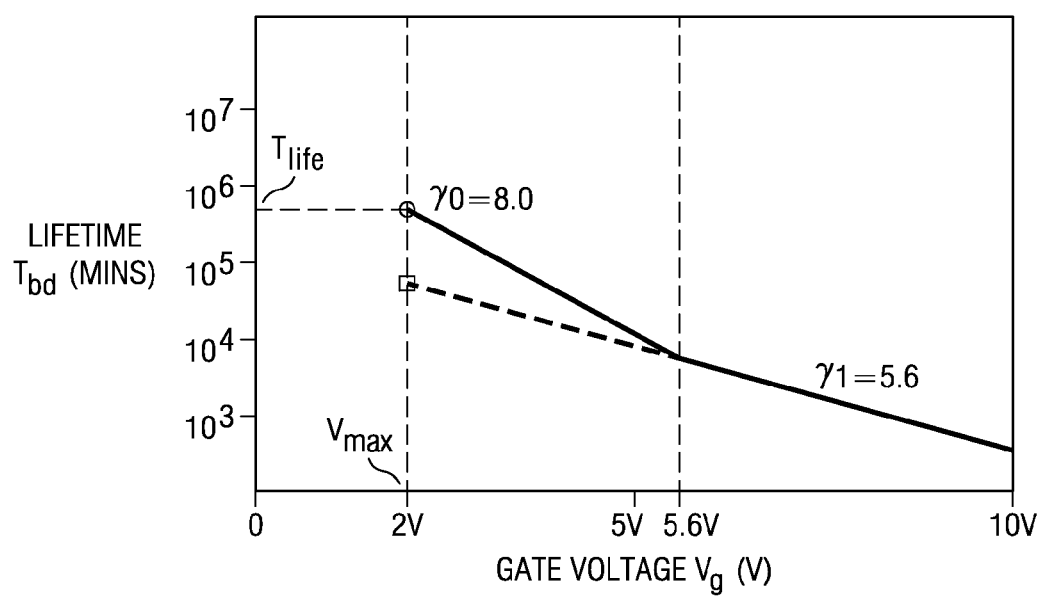
FIG. 11 shows a regression line describing the relationships between gate oxide layer lifetime $T_{bd}$ and voltage $V_g$ applied on a gate oxide layer, which is used for estimating the gate oxide layer lifetime according to another embodiment.

Expressions 7A, 7B from above are plotted against voltage acceleration factors "γ0" and "γ1" as shown in FIG. 11. The horizontal axis in linear scale represents stress voltage $V_g$ applied to the gate oxide layer 25 of an NMOS transistor 10 in FIG. 3, while the vertical axis in logarithmic scale represents the estimated gate oxide layer lifetime $T_{bd}$. In FIG. 10, the circle point corresponds to a nominal gate supply voltage $V_{max}$ of 2.0 V applied on the gate oxide layer of an NMOS device. The corresponding vertical coordinate represents the estimated gate oxide lifetime $T_{life}$ when the device is operating under $V_{max}$. The square point corresponds to an estimated gate oxide lifetime $T_{life}$ by "extrapolating" a $T_{bd}$-J relationship obtained when the NMOS device is stressed by voltages greater than 5.6 V.

It should be understood that the foregoing embodiments are so disclosed to illustrate the concept of the present invention. That is the correlation between source/drain current $I_{sd}$, substrate current $I_{sub}$, and gate dielectric layer breakdown time $T_{bd}$ can be utilized to obtain an empirical model describing the relationship between gate dielectric layer lifetime $T_{bd}$ and gate dielectric layer stress voltage $V_g$ through proper mathematical fitting techniques. A gate dielectric layer lifetime can be predicted from this model when it is under nominal device operating conditions. It should be realized, however, that various changes, substitutions and alterations can be made herein without departing from the spirit and scope of the invention as defined by the appended claims. For example, there exists many mathematical means for conducting statistical analysis on collected data and reaching empirical functions between various device parameters. Power law and exponential relationships obtained in foregoing embodiments are so disclosed to demonstrate this concept. It should not be construed as being limited to the embodiments set forth herein. As another example, the preferred embodiments can also be used to measure the TDDB lifetime of a dielectric layer used for a capacitor in an integrated circuit. In a further example, an empirical model describing the relationship between gate dielectric layer lifetime and stress voltages applied on a gate dielectric layer in a PMOS transistor can be obtained in similar manners.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of determining a time dependent electrical breakdown characteristic of a dielectric layer in a semiconductor device comprising:
   providing a plurality of samples of dielectric layer disposed as a gate dielectric layer of a MOS transistor;
   performing a first linear regression fit on data representing a logarithm of a source/drain current density distribution and data representing a logarithm of voltages applied on said samples;
   performing a second linear regression fit on data representing a logarithm of a substrate current density distribution and the data representing the logarithm of voltages applied on said samples;
   performing a third linear regression fit on data representing a logarithm of a dielectric layer lifetime distribution and second data representing a logarithm of the source/drain current density distribution and the substrate current density distribution on said samples;
   deriving, from said first, second, and third linear regression fits, an empirical model wherein a dielectric layer lifetime is a function of voltage applied thereon; and
   using said model to determine dielectric layer lifetime at a pre-determined operating gate voltage.

2. The method according to claim 1, wherein said samples of dielectric layer having substantially the same respective thicknesses.

3. The method of claim 1, wherein said steps of performing a first linear regression fit and performing a second linear regression fit include:
   applying to a first plurality of said samples gate voltage in an incremental manner and measuring source/drain current density and substrate current density at said incremental gate voltages;
   plotting data of measured source/drain and substrate current density at said incremental gate voltages; and
   fitting said data and obtaining a first and a second functions.

4. The method of claim 3, wherein said first and said second functions are power law functions.

5. The method of claim 3, wherein said first and said second functions are exponential functions.

6. The method of claim 1, wherein said step of performing a third linear regression fit includes:

applying to a second plurality of said samples a stress voltage and measuring, on each sample of said second plurality, gate leakage current density and time to breakdown;

plotting data of measured times to breakdown at said gate leakage current density; and fitting said data and obtaining a third function.

7. The method of claim 6, wherein said third function is a power law function.

8. The method of claim 6, wherein said third function is an exponential function.

9. The method of claim 1, wherein said step of deriving, from said first, second, and third linear regression fits, an empirical model wherein a dielectric layer lifetime is a function of voltage applied thereon, yields a function in the form of $T_{bd} \sim V_g^{-n}$, wherein $T_{bd}$ is dielectric layer lifetime, $V_g$ is applied voltage and n is a constant.

10. The method of claim 9, wherein n has a different value in different regions of said incremental gate voltages.

11. The method of claim 1, wherein said step of deriving, from said first, second, and third linear regression fits, an empirical model wherein a dielectric layer lifetime is a function of voltage applied thereon, yields a function in the form of $T_{bd} \sim e^{-\gamma V_g}$, wherein $T_{bd}$ is a dielectric layer lifetime, $V_g$ is an applied voltage, and $\gamma$ is a constant.

12. The method of claim 11, wherein said constant $\gamma$ has a different value in different regions of said incremental gate voltages.

13. A method of determining the lifetime of a dielectric layer in a semiconductor device comprising:

providing samples of dielectric layers having substantially the same thickness disposed as respective gate dielectric layers of a plurality of MOS transistors;

applying to a first plurality of said samples gate voltages in an incremental manner and measuring source/drain current density and substrate current density at each of said incremental gate voltages;

performing a first linear regression fit on data representing a logarithm of a source/drain current density distribution and data representing said incremental gate voltages;

performing a second linear regression fit on data representing a logarithm of a substrate current density distribution and the data representing said incremental gate voltages;

applying to a second plurality of said samples a stress voltage and measuring, on each sample, source/drain current density, substrate current density and time to breakdown;

performing a third linear regression fit on data representing a logarithm of a dielectric layer lifetime distribution and second data representing a logarithm of the source/drain and the substrate current density distribution; and deriving from said first, second, and third linear regression fits a model describing the relationship between time to breakdown and gate voltage applied thereon and estimating there from a dielectric layer lifetime at a predetermined operating gate voltage.

14. The method of claim 13, wherein said steps of performing a first and a second linear regression fits include:

obtaining a linear distribution plotting said source/drain current density and said substrate current density at each of said incremental gate voltages;

fitting said distribution using a linear regression line; and obtaining a slope of said linear regression line.

15. The method of claim 14, wherein said linear distribution is between said source/drain and substrate current density in logarithmic scale and said gate voltages in linear scale and said step of fitting said distribution using a linear regression line yields linear regression lines in the forms of $\ln J_{sd} \sim S1 V_g$, and $\ln J_{sub} \sim S2 V_g$ wherein $J_{sd}$ is a source/drain current density, $J_{sub}$ is a substrate current density, $V_g$ is an applied voltage, and S1 and S2 are constant.

16. The method of claim 15, wherein $J_{sub}$ is negligibly small and said step of fitting said distribution using a linear regression line yields a linear regression line in the form of $\ln J_g = \ln J_{sd} \sim SV_g$, wherein $J_{sd}$ is a source/drain current density, $V_g$ is an applied voltage, and S is a constant.

17. The method of claim 15, wherein said constant S1 and S2 have different values in different regions of gate voltage values, respectively.

18. The method of claim 13, wherein said step of performing a third linear regression fit includes:

obtaining a linear distribution plotting said source/drain current density, said substrate current density and times to breakdown;

fitting said distribution using a linear regression line; and obtaining a slope of said linear regression line.

19. The method of claim 18, wherein said linear distribution is between said times to breakdown and said source/drain and said substrate current densities in logarithmic scale and said step of fitting said distribution using a linear regression line yields a linear regression line in the form of $\ln T_{bd} \sim -m \ln(J_{sd} J_{sub}) = -m \ln J_g$, wherein $T_{bd}$ is a dielectric layer lifetime, $J_g$ is a gate leakage current density, $J_{sd}$ is a source/drain current density, $J_{sub}$ is a substrate current density, and m is a constant.

20. The method of claim 18, wherein said substrate current density is negligibly small and fitting said distribution using a linear regression line yields a linear regression line in the form of $\ln T_{bd} \sim -m \ln J_{sd} = -m \ln J_g$, wherein $T_{bd}$ is a dielectric layer lifetime, $J_g$ is a gate leakage current density, $J_{sd}$ is a source/drain current density, and m is a constant.

21. The method of claim 13, wherein said step of deriving a model describing the relationship between times to breakdown and gate voltage applied thereon yields a function in the form of $T_{bd} \sim V_g^{-n}$, wherein $T_{bd}$ is a dielectric layer lifetime, $V_g$ is an applied voltage, and n is a constant.

22. The method of claim 21, wherein n has a different value in different regions of said gate voltage values.

23. A method of determining the lifetime of a gate dielectric layer in a MOS transistor comprising:

providing a plurality of MOS transistors each having gate dielectric layer of same material;

applying to a first plurality of said transistors gate voltages in an incremental manner and measuring source/drain current density and substrate current density at each of said incremental gate voltages;

performing a first linear regression fit on data representing a logarithm of said source/drain current density and data representing a logarithm of said gate voltages;

performing a second linear regression fit on data representing a logarithm of said substrate current density and the data representing a logarithm of said gate voltages;

obtaining a first function from the first linear regression fit describing a relationship between said gate voltages and said source/drain current density;

obtaining a second function from the second linear regression fit describing a relationship between said gate voltages and said substrate current density;

applying to a second plurality of said transistors a stress voltage and measuring, on each sample, source/drain current density, substrate current density and time to breakdown;

performing a third linear regression fit on data representing a logarithm of a dielectric layer lifetime distribution and second data representing a logarithm of the source/drain current density and the substrate current density on said second plurality of said transistors;

obtaining a third function describing a relationship between said source/drain current density, said substrate current density and times to breakdown on said second plurality of said transistors; and obtaining a fourth function describing a relationship between said gate voltages and the times to breakdown and estimating a dielectric layer lifetime at a pre-determined operating gate voltage.

24. The method of claim 23, wherein said MOS transistors each having gate dielectric layers of substantially same thickness.

25. A method of determining the lifetime of a gate dielectric layer in a MOS transistor comprising:

providing a plurality of MOS transistors each having gate dielectric layer of a same material;

applying to a first plurality of said transistors gate voltages in an incremental manner and measuring source/drain current density at each of said incremental gate voltages;

performing a first linear regression fit on data representing a logarithm of said source/drain current density and data representing said gate voltages;

obtaining a first function from the first linear regression fit describing a relationship between said gate voltages and said source/drain current density;

applying to a second plurality of said transistors a stress voltage and measuring, on each sample, source/drain current density and time to breakdown;

performing a second linear regression fit on data representing a logarithm of a dielectric layer lifetime distribution and data representing a logarithm of the source/drain current density on said second plurality of said transistors;

obtaining a second function describing relationships between said source/drain current density and times to breakdown on said second plurality of said transistors; and obtaining a third function describing a relationship between the gate voltages and the times to breakdown and estimating a dielectric layer lifetime at a pre-determined operating gate voltage.

* * * * *